United States Patent
Kim

[11] Patent Number: 5,922,495
[45] Date of Patent: Jul. 13, 1999

[54] MASK FOR USE IN STITCHING EXPOSURE PROCESS

[75] Inventor: Hyeong Soo Kim, Ichon-shi, Rep. of Korea

[73] Assignee: Hyundai Electronics Industries Co., Ltd., Ichon-shi, Rep. of Korea

[21] Appl. No.: 08/940,290

[22] Filed: Sep. 30, 1997

Related U.S. Application Data

[30] Foreign Application Priority Data

Oct. 2, 1996 [KR] Rep. of Korea ............ 96-43634

[51] Int. Cl.$^6$ ...................................... G03F 9/00
[52] U.S. Cl. ........................................... 430/5
[58] Field of Search ................. 430/5, 322, 396; 355/53, 77

[56] References Cited

U.S. PATENT DOCUMENTS

| | | | |
|---|---|---|---|
| 5,260,151 | 11/1993 | Berger et al. | 430/5 |
| 5,532,090 | 7/1996 | Borodovsky | 430/5 |
| 5,571,641 | 11/1996 | Bae | 430/5 |

*Primary Examiner*—S. Rosasco
*Attorney, Agent, or Firm*—Thelen Reid & Priest LLP

[57] ABSTRACT

A mask structure used in the lithography process for semiconductors is disclosed. The mask structure comprises upper and lower masks, a light-blocking pattern formed on a region where the upper mask and the lower masks overlap one another, wherein a line width of the light-blocking pattern in the overlapping region is larger than that of in a non-overlapping region or a dummy light-blocking pattern having minute line width is formed between the light-blocking patterns so that the excessive light could not reach to the overlapping region of the upper and the lower masks due to repeated exposure in the stitching exposure process for forming a mask pattern by overlapping the masks in case that a chip size is larger than an exposure area exposed by an exposure equipment.

2 Claims, 3 Drawing Sheets

MASK FOR USE IN STITCHING EXPOSURE PROCESS

BACKGROUND OF THE INVENTION

1. Field of the Invention

This invention relates to a mask for use in the lithography process of semiconductor devices, and more particularly to a mask for use in a stitching exposure technique for forming a mask pattern by overlapping at least two masks especially in the case that a chip size is larger than an exposure area exposed by exposure equipment.

2. Description of the Prior Art

The stitching exposure is a technique for separately exposing at least two masks to fabricate a semiconductor chip. In this technique, an overlapping region is normally placed between the masks so that the patterns of the separately exposed region are connected together.

A conventional mask used in a stitching exposure will be explained with reference to FIGS. 1 and 2.

FIGS. 1 and 2 show an upper mask 100 and a lower mask 200 each of which has a light blocking pattern 20 such as a chrome pattern attached on a transparent wafer substrate such as a quartz wafer. In use, a photosensitive layer deposited over the wafer is first exposed using the upper mask 100, and secondly exposed using the lower mask 200, and then developed by a photolithography process to form a photosensitive pattern.

At this stage, respective overlapping regions 30 are placed between the lower portion of the upper mask 100 and the upper portion of the lower mask 200 in order to align the masks 100 and 200.

However, in separately exposing the masks 100 and 200 as described above, negative effects may occur in the region where the photosensitive pattern should maintain since the intensity of light (i.e., a beam energy) passing through the overlapping region becomes higher than that of other regions.

FIG. 3 is a plane view illustrating a photosensitive pattern 50 which is obtained by exposing the photosensitive layer deposited on the upper surface of the wafer using the masks 100 and 200, and then by developing by the photolithography process. As shown in FIG. 3, the line width of the photosensitive pattern 50 is narrowed in the overlapping region of the masks. As the photosensitive pattern is narrowed as described above, the photosensitive pattern may collapse or be cut off in the worst condition during the developing and cleaning process.

SUMMARY OF THE INVENTION

It is an object of the present invention to solve the problem involved in the prior art, and to provide a mask in which the line width of light-blocking patterns at the overlapping region is widened or a minute light-blocking pattern is provided between the light-blocking patterns so that excessive light is prevented from passing through the masks due to the repeated exposure of the region where the upper and the lower masks are overlapped.

In one aspect of the present invention, there is provided a mask structure having an upper mask and a lower mask for a stitching exposure process, comprising a transparent substrate, and light-blocking patterns formed on a region of said transparent substrate where the upper mask and the lower mask are overlapped, wherein a line width of the light-blocking patterns in the overlapping region is larger than that in a non-overlapping region, so that an energy of light reaching the wafer through the overlapping region becomes identical to that reaching a wafer through non-overlapping regions during the exposure process.

In another aspect of the present invention, there is provided a mask structure having an upper mask and a lower mask for a stitching exposure process, comprising a transparent substrate, light-blocking patterns formed on a region wherein the upper mask and the lower mask are overlapped, and a dummy light-blocking pattern having a minute line width and provided in a space between the light-blocking patterns in the region wherein the upper mask and the lower mask are overlapped so that an energy of light reaching a wafer through the overlapping region becomes identical to that reaching the wafer through the non-overlapping region during the exposure process.

BRIEF DESCRIPTION OF THE DRAWINGS

The above object and other features of the present invention will become more apparent by describing the preferred embodiments thereof with reference to the accompanying drawings, in which.

DETAILED DESCRIPTION OF THE PREFERRED EMBODIMENT

The preferred embodiments of the present invention will now be explained with reference to the accompanying drawings.

Figure 1:
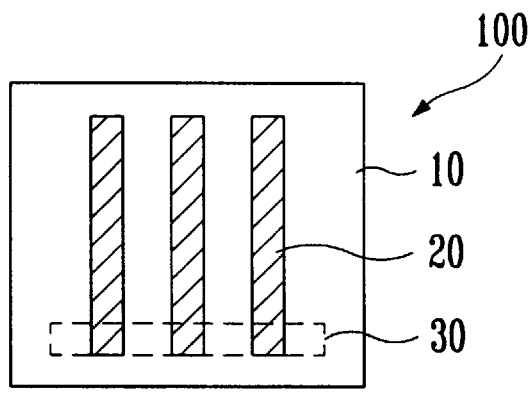
FIGS. 1 and 2 are plan views illustrating conventional upper and lower masks for the stitching exposure process.
Figure 2:
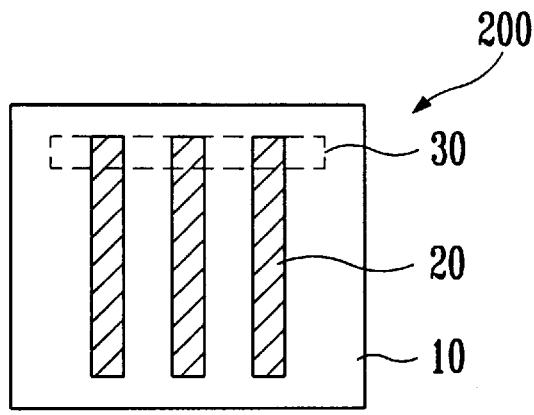
Figure 3:
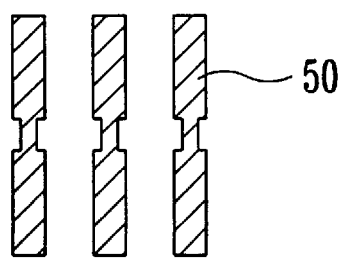
FIG. 3 is a plan view illustrating the line width of a photosensitive pattern which is narrowed in an overlapping region of the masks, wherein the exposure process is performed using the upper and the lower masks and the photosensitive pattern is formed by the photolithography process.
Figure 4:
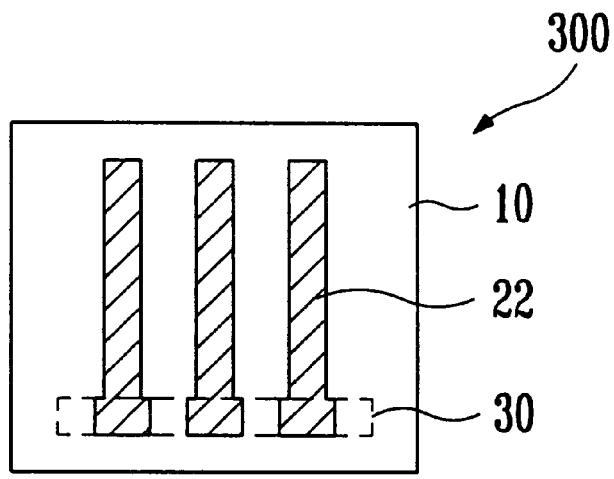
FIGS. 4 and 5 are plan views illustrating upper and lower masks fabricated according to a first embodiment of the present invention.
Figure 5:
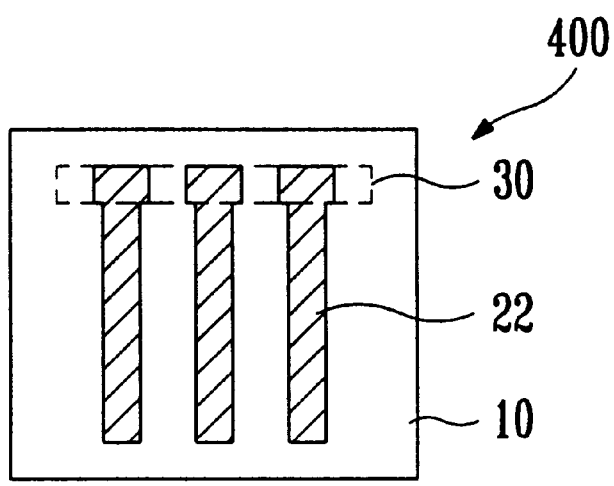

FIGS. 4 and 5 are plan views illustrating upper and lower masks 300 and 400 fabricated according to a first embodiment of the present invention.

Referring to FIGS. 4 and 5, a light-blocking pattern 22 is formed on the surface of a transparent substrate 10 as in the prior art. In this embodiment, a line width of the light-blocking pattern 22 in an overlapped region 30 of the upper and the lower masks is larger than that of other light-blocking patterns for non-overlapping region. Thereby the intensity of the light passing through the overlapping region 30 to the wafer placed on a lower portion is identical to the light reaching the wafer through the overlapping region when the exposure process is performed twice using the upper and the lower masks 300 and 400.

Figure 6:
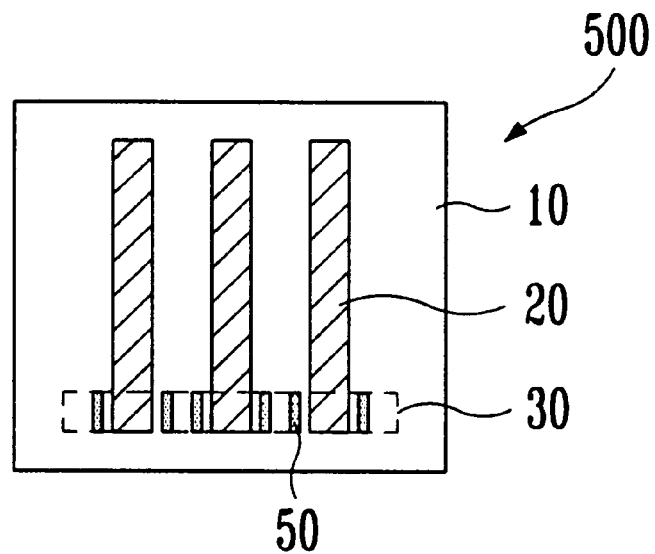
FIGS. 6 and 7 are plan views illustrating upper and lower masks fabricated according to a second embodiment of the present invention.
Figure 7:
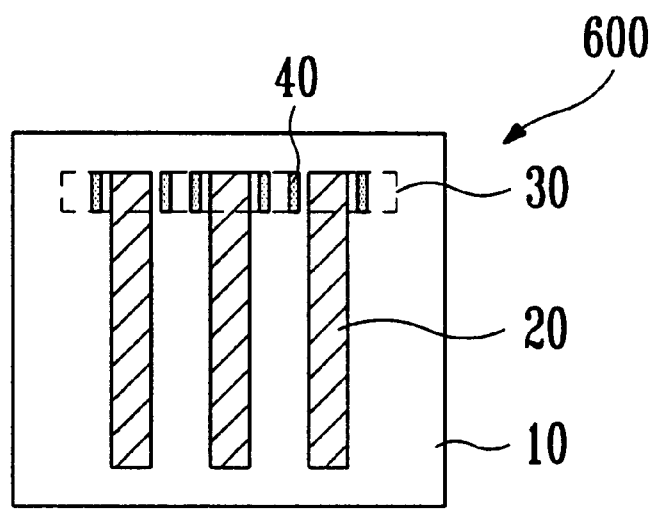

FIGS. 6 and 7 are plan views illustrating upper and lower masks 500 and 600 fabricated according to a second embodiment of the present invention.

Referring to FIGS. 6 and 7, a light-blocking pattern 20 is formed on the surface of a transparent substrate 10 as in the prior art. In this embodiment, a dummy light-blocking pattern 50 having minute line width is formed in the space between light-blocking pattern 20 placed in an overlapped region 30 of the upper and the lower masks 500 and 600 so as to not allow formation of the pattern during the photolithography process performed after the exposure process. Thereby the light passing through the overlapped region 30 to the wafer placed on a lower portion is identical to the light reaching the wafer through the overlapping region when the exposure process is performed twice by using the upper and the lower masks 500 and 600.

According to the present invention as described above, when the photosensitive pattern is fabricated by using the upper and lower masks for the stitching exposure process, the problems involved in the prior art, wherein the size of the pattern did not transcribe identically to a desired design in the overlapped region, and wherein the photosensitive pattern is collapsed on the photolithography process due to an increase in the intensity of the light at a repeatedly exposed region, will be overcome.

Many modifications and variations of the present invention are possible in light of the above teachings. Therefore, it is to be understood that within the scope of the appended claims, the invention may be practiced otherwise than as specifically described.

What is claimed is:

1. A mask structure for use in a stitching exposure process, the mask structure comprising:
    a) an upper mask formed over a transparent substrate and having a first light-blocking pattern formed with a first line width; and
    b) a lower mask formed over the transparent substrate and having a second light-blocking pattern formed with a second line width;
    wherein the lower mask overlaps the upper mask in an overlapping region; and
    wherein the first and second line widths are larger in the overlapping region than the respective first and second line widths in a non-overlapping region;
    whereby energy of light reaching a wafer through the overlapping region is adjusted to be identical to energy of light reaching the wafer through the non-overlapping region when the exposure process is performed.

2. A mask structure for use in a stitching exposure process, the mask structure comprising:
    a) an upper mask formed over a transparent substrate and having a first light-blocking pattern;
    b) a lower mask formed over the transparent substrate and having a second light-blocking pattern; and
    c) a dummy light-blocking pattern having a minute size that does not form a pattern after the exposure process;
    wherein the dummy light-blocking pattern is provided in a space between the first and second light-blocking patterns in an overlapping region in which the lower mask overlaps the upper mask;
    whereby energy of light reaching a wafer through the overlapping region is adjusted to be identical to energy of light reaching the wafer through the non-overlapping region when the exposure process is performed.

* * * * *